United States Patent
Loehndorf et al.

(10) Patent No.: US 8,049,490 B2
(45) Date of Patent: Nov. 1, 2011

(54) SILICON MEMS RESONATOR DEVICES AND METHODS

(75) Inventors: Markus Loehndorf, Munich (DE); Wolfgang Raberg, Sauerlach (DE); Florian Schoen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 497 days.

(21) Appl. No.: 12/193,780

(22) Filed: Aug. 19, 2008

(65) Prior Publication Data

US 2010/0045274 A1  Feb. 25, 2010

(51) Int. Cl.
*G01R 33/09* (2006.01)
(52) U.S. Cl. .................................. 324/207.21
(58) Field of Classification Search .................. None
See application file for complete search history.

(56) References Cited

U.S. PATENT DOCUMENTS

| | | | | |
|---|---|---|---|---|
| 3,814,863 | A | * | 6/1974 | O'Day et al. ............ 360/327.21 |
| 4,851,762 | A | * | 7/1989 | Kim et al. ..................... 324/71.6 |
| 5,106,826 | A | * | 4/1992 | Alford et al. ................... 505/202 |
| 5,525,901 | A | * | 6/1996 | Clymer et al. ............ 324/207.21 |
| 6,883,384 | B2 | * | 4/2005 | Takada et al. ..................... 73/779 |
| 6,940,370 | B2 | | 9/2005 | Bircumshaw et al. | 
| 7,847,542 | B2 | * | 12/2010 | Bartos et al. ................... 324/252 |
| 2002/0178831 | A1 | | 12/2002 | Takada | 
| 2003/0030527 | A1 | | 2/2003 | Mhani | 
| 2006/0158268 | A1 | | 7/2006 | McCorquodale et al. | 
| 2007/0125161 | A1 | | 6/2007 | Bryzek et al. | 
| 2007/0152537 | A1 | | 7/2007 | Yamaguchi et al. | 
| 2007/0176519 | A1 | | 8/2007 | Shiaa et al. |

FOREIGN PATENT DOCUMENTS

WO   WO 2006/106456   10/2006

OTHER PUBLICATIONS

C. T.-C. Nguyen, MEMS Technologies for Communications; Techn. Proceedings, 2003 Nanotechnology Conference and Trade Show, San Francisco, California, Feb. 23-27, 2003; pp. 452-455, (4 pages).
C. T.-C. Nguyen; Frequency-Selective MEMS for Miniaturized Communication Devices; Proceedings, 1998 IEEE Aerospace Conference, vol. 1, Snowmass, Colorado, Mar. 21-28, 1998, pp. 445-460, (16 pages).
E.Y. Tsymbal; Theory of magnetostatic coupling in thin-film rectangular magnetic elements, applied physics letter, vol. 77, No. 17, Department of Materials, University of Oxford, Oct. 23, 2000; pp. 2740-2742 (3 pages).
Ville Kaajakari et al., Phase Noise in Capacitively Coupled Micromechanical Oscillators, IEEE Transactions on Ultrasonics, Ferroelectrics, and Frequency Control, vol. 52, No. 12, Dec. 12, 2005, pp. 2322-2331, (10 pages).
German Office Action, Application No. DE102009036175.8, dated Jun. 7, 2011, 6 pages.

* cited by examiner

*Primary Examiner* — Paresh Patel
(74) *Attorney, Agent, or Firm* — Patterson Thuente Christensen Pedersen, P.A.

(57) ABSTRACT

Embodiments of the invention are related to MEMS devices and methods. In one embodiment, a MEMS device includes a resonator element comprising a magnetic portion having a fixed magnetization, and at least one sensor element comprising a magnetoresistive portion, wherein a magnetization and a resistivity of the magnetoresistive portion vary according to a proximity of the magnetic portion.

11 Claims, 4 Drawing Sheets

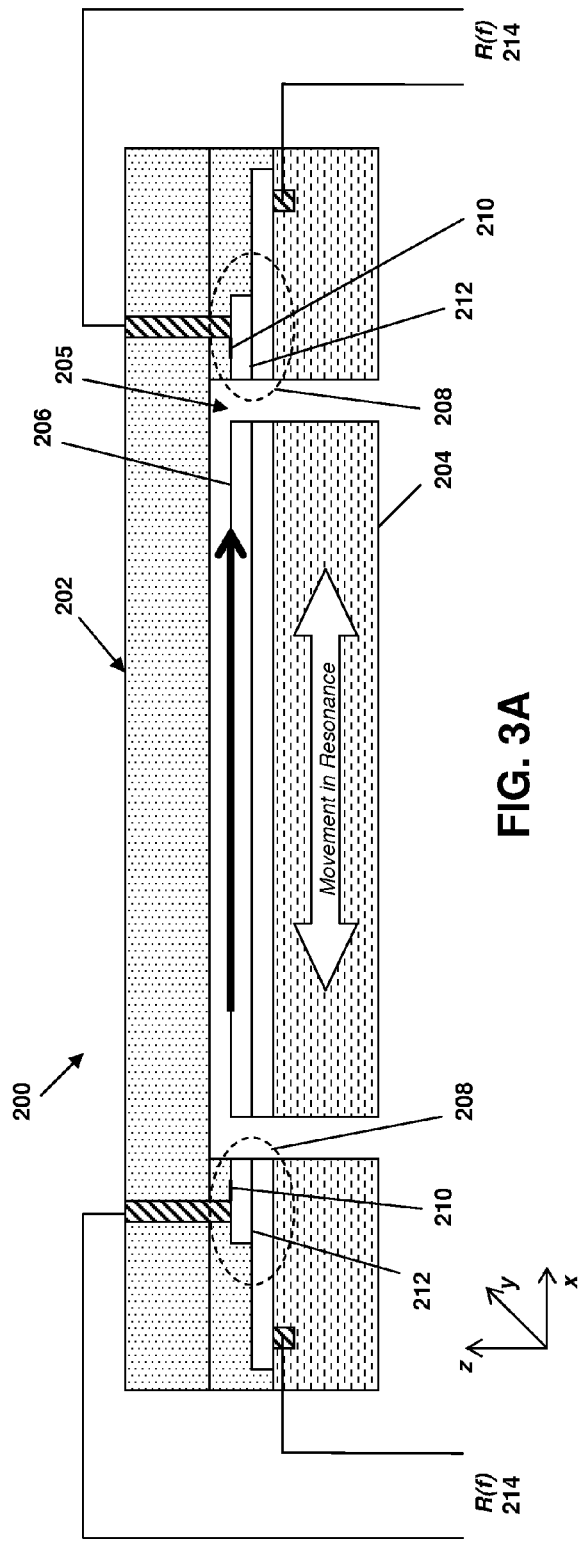
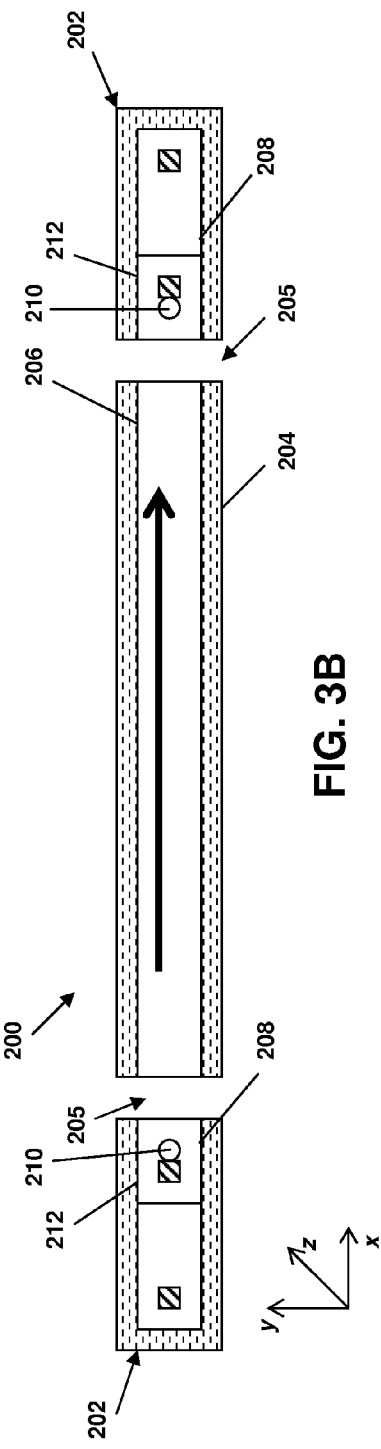
FIG. 3A
FIG. 3B

SILICON MEMS RESONATOR DEVICES AND METHODS

BACKGROUND

Silicon micro-electromechanical system (MEMS) resonators can have frequency reference applications, commonly using capacitive detection and actuation principles. For example, small electrodes positioned between the resonator and the support structure can capacitively detect relative gap changes as the resonator resonates. The resonance frequency can then be derived.

There are several disadvantages, however, to such configurations. One disadvantage is that the input and output impedances are high. Additionally, parasitic capacitances have an increasing influence as structure sizes decrease.

SUMMARY

Embodiments of the invention are related to MEMS devices and methods. In one embodiment, a MEMS device includes a resonator element comprising a magnetic portion having a fixed magnetization, and at least one sensor element comprising a magnetoresistive portion, wherein a magnetization and a resistivity of the magnetoresistive portion vary according to a proximity of the magnetic portion.

In another embodiment, a silicon MEMS device includes a support structure defining a cavity, a resonator element disposed in the cavity and comprising a magnetic portion having a fixed magnetization, at least one magnetoresistive portion disposed in the support structure and having a magnetization configured to vary according to a proximity of the magnetic portion, and circuitry coupled to the at least one magnetoresistive portion and adapted to sense a resistance of the magnetoresistive portion.

In yet another embodiment, a method includes measuring a resistance of a magnetoresistive portion of a resonator device, and determining a resonant frequency of a resonator element of the resonator device from the resistance.

BRIEF DESCRIPTION OF THE DRAWINGS

The invention may be more completely understood from the following detailed description of various embodiments in connection with the accompanying drawings, in which:

FIG. 3A is a cross-sectional diagram of a resonating device according to one embodiment.

FIG. 3B is a top view cross-sectional diagram of the resonating device of FIG. 3A.

Figure 1:
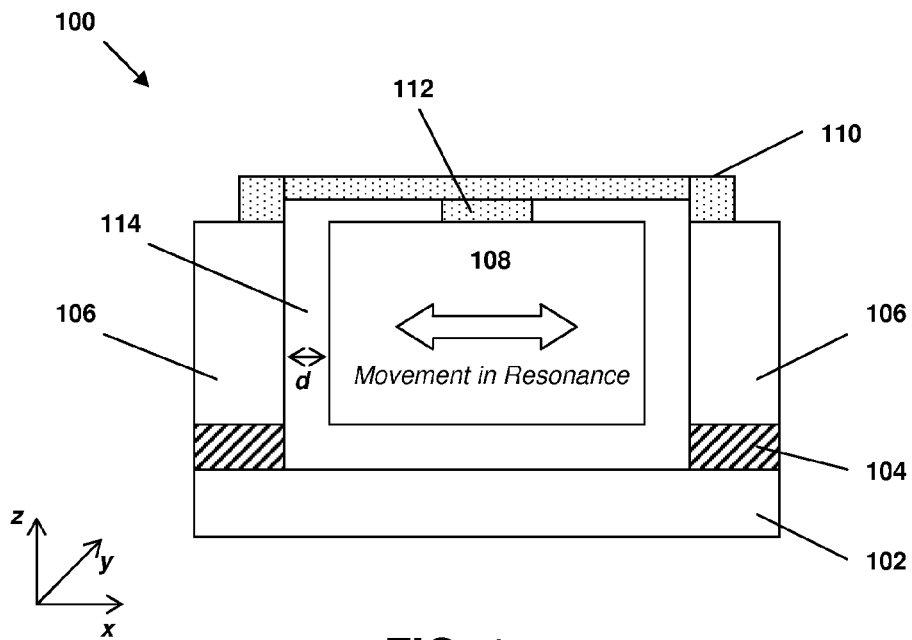
FIG. 1 is a diagram of a resonating device according to one embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments of the invention relate to micro-electromechanical system (MEMS) technology, such as silicon resonator devices which comprise xMR sensor structures. Various embodiments of the invention can be more readily understood by reference to FIGS. 1-5 and the following description. While the invention is not necessarily limited to the specifically depicted application(s), the invention will be better appreciated using a discussion of exemplary embodiments in specific contexts.

In FIG. 1, one embodiment of a silicon MEMS resonator device 100 is depicted. Resonator device 100 is formed on a substrate 102, and an insulating layer 104, such as silicon dioxide in one embodiment, is formed on substrate 102. An electrode 106 is formed on layer 104.

Resonator device 100 further comprises a resonating element 108 coupled to a top sealing portion 110 by an anchor 112. Resonating element 108 is separated from electrode 106 by a cavity 114. Resonating element 108 moves or resonates in the x-y plane, generating a reference frequency. Resonators can be designed such that they resonate in other or additional planes, as in other embodiments.

Resonating element 108 and electrode 106 are separated by a distance d. Resonating element 108 and electrode 106 can thus be approximated as a parallel plate capacitor having a capacitance (C).

$$C = \frac{\varepsilon A}{d - x}$$

In the above equation, $\varepsilon$ is the dielectric constant, A is the electrode area, d is the gap distance between the two plates, and x is the movement in operation.

In operation, a combination of an AC voltage and a DC voltage can be applied to the electrode:

$$U = u_{dc} + u_{ac} \sin(\omega t)$$

This voltage forces the resonator to move. The resonator itself can be described as an actuated spring-mass-damper system, e.g. a harmonic, damped, forced oscillator:

$$F = m\frac{\partial^2 x}{\partial t^2} + c\frac{\partial x}{\partial t} + kx$$

where F is the actuating force, m is the mass of the resonator, c is the damping coefficient, k is the stiffness of the resonator, and x is its deflection. The force is now an electrostatic force and can be written as follows:

$$F = \frac{1}{2}U^2\frac{\partial C}{\partial x}$$

If the frequency of the actuating AC voltage is now the same as the natural frequency of the resonator, the resonator will begin to move. This movement causes a current to flow through the electrode-resonator system, which can then be provided as an input for an amplifier.

Figure 2A:
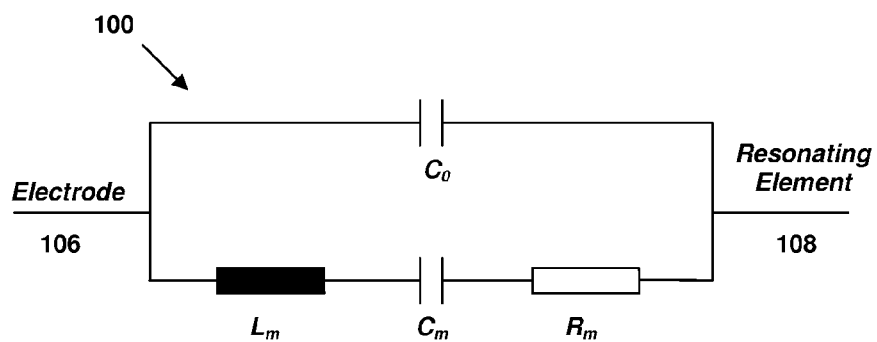
FIG. 2A is a model of the resonating device of FIG. 1.

From the above, resonator devices can be electrically modelled with a Butterworth-van-Dyke model, as depicted in FIG. 2A. The series resonant frequency $f_s$ of resonating element 108 is defined by the motional inductance ($L_m$) and capacitance ($C_m$) and in mechanical terms by the stiffness (k) and the mass (m) of resonating element 108.

$$f_S = \frac{1}{2\pi} \frac{1}{\sqrt{L_m C_m}} = \frac{1}{2\pi} \sqrt{\frac{k}{m}}$$

The resonant frequency $f_s$ is therefore not dependant on the area of electrodes 106 and resonating element 108.

In series resonance, the total impedance of the system is related to the motional resistance ($R_m$) of resonating element 108. It can be described by:

$$R_m = \frac{\sqrt{km}}{Q\eta^2}$$

where Q is the quality factor of the resonator and $\eta$ is the so-called electromechanical coupling, which is related to an applied DC-bias voltage ($u_{dc}$), the distance between electrode 106 and resonating element 108 (d) as well as the static capacitance in between ($C_0$).

$$\eta = u_{dc} \frac{C_0}{d}$$

Knowing that the static capacitance $C_0$ is the capacitance of a parallel plate capacitor and that there is no dielectric in the gap, the electromechanical coupling can be expressed as:

$$\eta = u_{dc} \varepsilon_0 \frac{A_{el}}{d^2}$$

The motional resistance which governs the impedance in series resonance then becomes:

$$R_m = \frac{\sqrt{km}}{Q\eta^2} = \frac{\sqrt{km}}{Q} \frac{d^4}{A_{el}^2 u_{dc}^2 \varepsilon_0^2}$$

In the case of series resonance, the motional inductance and the motional capacitance cancel each other out, and the impedance seen at the input and output of the resonator is related to the motional resistance. In order to have a stable resonating system, an amplifier connected to the resonator should compensate for this motional resistance, i.e., the amplifier should have a negative resistance equal to the motional resistance in operation and higher for start-up.

Figure 2B:
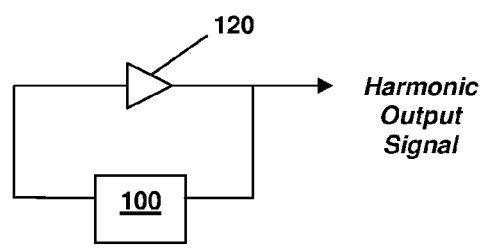
FIG. 2B is a model of a system of the resonating device of FIGS. 1 and 2A.

Referring to FIG. 2B, a system model of resonator 100 and an amplifier 120 is depicted. The input of amplifier 120 is the output of resonator 100, and vice-versa. Thus, the current flowing through resonator 100 is the input for amplifier 120 and "generates" a sinusoidal voltage drop at its output. This voltage drop can now be used to drive resonator 100, while also serving as a sinusoidal frequency reference signal.

According to various embodiments of the invention, the resonator will further comprise a magnetic material in or on the resonating element to provide a defined stray magnetic field. Magnetoresistive effect, or xMR, sensors can then be positioned in or on the resonator support structure in close distance to the magnetic field. Relative movements of the resonator element can then produce a change in the magnetic field, and thus also lead to changes that can be sensed by the xMR sensors. A rotation of a sense layer of the xMR sensor will lead to a change of the magnetoresistance, which can be detected and quantified such that a resonant frequency of the resonator element can be determined.

Referring to FIGS. 3A and 3B, one embodiment of a resonator device 200 is depicted. Resonator device 200 comprises a support structure 202 and a resonator element 204. Support structure 202 defines part or all of a cavity 205 in which resonator element 204 is partially or fully disposed. Although not shown in FIGS. 3A and 3B, support structure 202 can comprise a lower portion, such as is depicted in FIG. 1, formed on a substrate. Other structures and configurations can be used in other embodiments. In one embodiment, resonator element 204 is coupled to support structure 202 by an anchor (not shown) that permits movement in resonance of resonator element 204. A variety of anchoring structures, positions and configurations can be used in various embodiments, as appreciated by one skilled in the art. In the embodiment of FIGS. 3A and 3B, resonance of resonator element 204 is in the x-y plane, although resonator device 200 can be configured such that resonator element 204 resonates in other or additional planes in other embodiments.

In one embodiment, a magnetic dipole element 206 is formed on resonator element 204. In the embodiment of FIGS. 3A and 3B, magnetic dipole element 206 is formed along a length and a central portion of a width of resonator element 204. In other embodiments, magnetic dipole element 206 can comprise alternate structures and configurations, such as extending along only a portion of the length and/or over a narrower, wider, or entire width of resonator element 202. Magnetic dipole element 206 comprises a hard magnetic material, such as a thin film or particle, in one embodiment and has a fixed magnetization direction, as shown by the solid arrow in each of FIGS. 3A and 3B. This fixed magnetization can be in an alternate direction, such as right to left, in other embodiments.

Resonator device 200 further comprises sensor elements 208 formed in or on support structure 202. In the embodiment of FIGS. 3A and 3B, a first sensor element 208 is disposed in a left-side portion of support structure 202 and a second sensor element 208 is disposed in a right-side portion of support structure 202 (relative to the orientation depicted in FIGS. 3A and 3B). In other embodiments, such as an embodiment described herein below with respect to FIG. 5, sensor elements 208 can be disposed in other positions in or on support structure 202 or relative to resonator element 204. In general, however, sensor elements 208 are positioned such that they can sense a magnetic field related to magnetic dipole element 206.

In one embodiment, sensor elements 208 comprise magnetoresistive effect elements or portions, referred to as xMR elements 210, in a sense layer 212. xMR elements 210 include tunneling magnetoresistive (TMR), giant magnetoresistive (GMR), anisotropic magnetoresistive (AMR), and others. In one embodiment, magnetic dipole element 206 and sensor elements 208 are formed of the same material or materials, such as a spinvalve TMR stack, for example.

Magnetic dipole element 206 and sensor elements 208 provide resonance detection based on resistance, as opposed to capacitance as in other MEMS resonator structures. The magnetization of magnetic dipole element 206 is fixed according to magnetostatic laws due to the large aspect ratio between the width and the length of magnetic dipole element 206 on resonator element 204, while the magnetization of sensor elements 208, in particular xMR elements 210, is easily altered by the stray field of magnetic dipole element 206 and varies because of and with the resonance of resonator element 204. The change, or rotation, of the magnetization of xMR element 210 in sense layer 212 of sensor elements 208 results in a change of the magnetoresistance, $R_f$, of sensor elements 208, which can be detected. As shown in FIGS. 3A and 3B, $R_f$ can be measured at measurement points 214, such as electrodes, contact points or terminals in various embodiments. Other measurement elements, circuits, positions and arrangements can be used in other embodiments. In embodiments comprising TMR elements, resistance changes on the order of about 50 to about 200 percent are possible. Hence, small magnetic field changes can be directly transferred into large resistance changes that can be easily measured. A resonance frequency of resonator element 204 can be determined from this change in resistance. Embodiments of the invention therefore provide more sensitive detection and allow for the fabrication of smaller MEMS resonator devices through the reduction or elimination of the problem of increasing parasitic capacitances that exists in standard silicon MEMS resonator devices.

The resistance of the left-side (again, relative to the orientation depicted in FIGS. 3A and 3B) sensor element 208 has a phase difference of 180 degrees as compared to the resistance of the right-side sensor element 208, providing a differential readout arrangement. The electrical properties of sensor elements 208 can be designed independently of the properties of resonator element 204 and optimized for a desired feedback loop.

Figure 4:
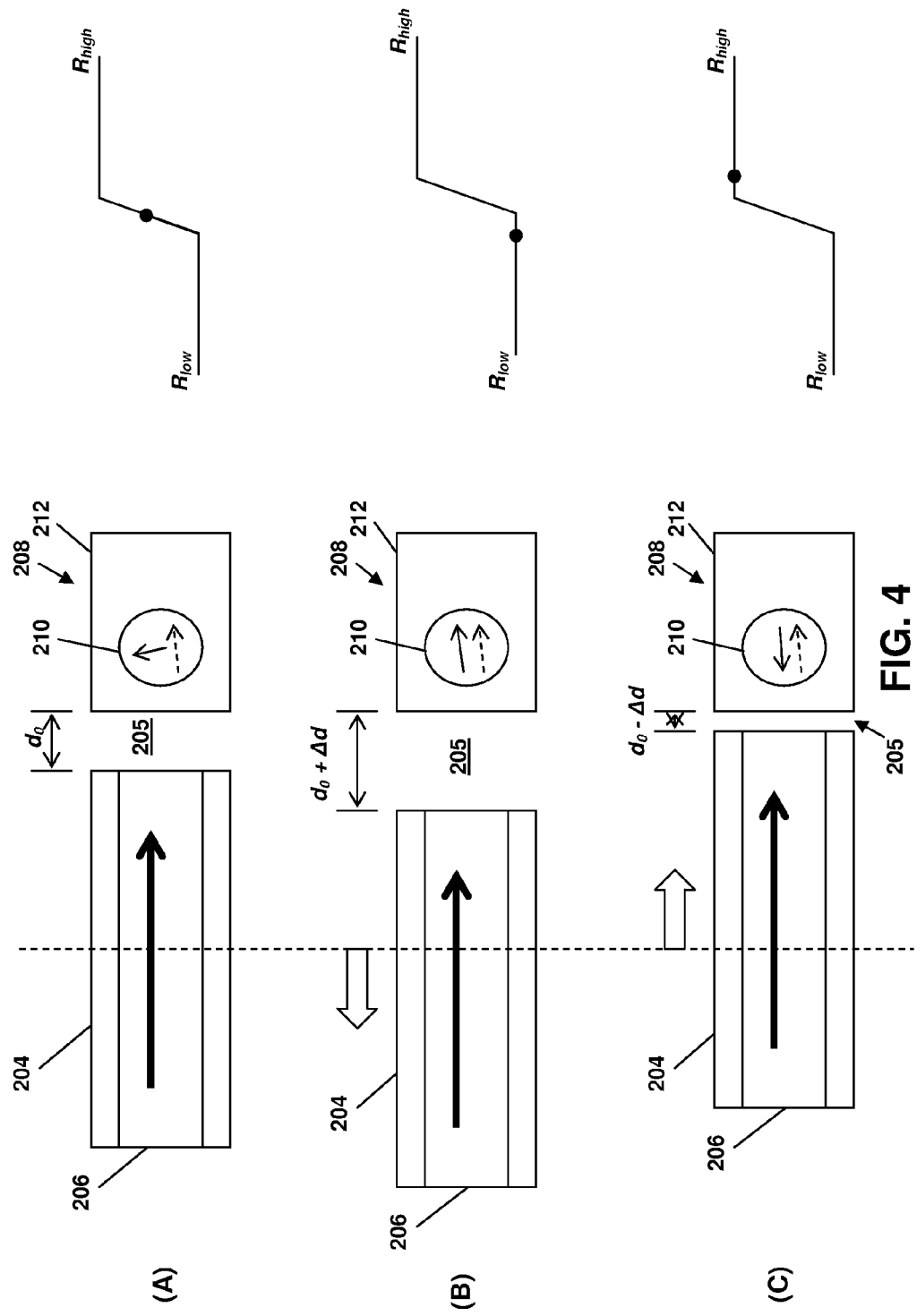
FIG. 4 is a diagram of a resonator element in various resonance positions according to one embodiment.

Referring to FIG. 4, resonator element 204 is depicted in three different example positions during resonance. Only one of two sensor elements 208 is depicted in FIG. 4, here the right-side element. Sensor element 208 includes xMR portion 210 in sense layer 212, and illustrated within each xMR portion 210 are the reference magnetization (small arrows in dashed line) and the magnetization during resonance of resonator element 204 (small arrows in solid line).

At position (A), resonator element 204 is at a neutral center position, spaced apart from each sensor element 208 by a distance $d_0$. In one embodiment, $d_0$ is less than about one micron. The resulting resistance of xMR sensor element 208 is therefore at neither a high nor a low position, as shown on the curve at the right.

At position (B), resonator element 204 has moved away from sensor element 208 by $\Delta d$, for a total separation distance of $d_0+\Delta d$. In this position, the magnetization of xMR portion 210 is the same as the reference, or pre-aligned, magnetization, because the effects of magnetic dipole element 206 are minimized, i.e., the strength of the magnetic field of magnetic dipole element 206 at sensor element 208 is low. The resistance is therefore relatively low.

At position (C), resonator element 204 has moved closer to sensor element 208, resulting in a separation distance of $d_0-\Delta d$. In this position, the magnetization of xMR portion 210 opposes the reference magnetization because of the effects of now-closer magnetic dipole element 206, i.e., the strength of the magnetic field of magnetic dipole element 206 at sensor element 208 is high. The resistance is therefore relatively high.

As previously mentioned, only the right-side sensor element 208 is depicted in FIG. 4. The effects on the left-side sensor element 208 at positions (B) and (C) would thus be the opposite of those described above, i.e., 180 degrees out of phase, as resonator element 204 resonates in the space between the two sensor elements 208.

Figure 5:
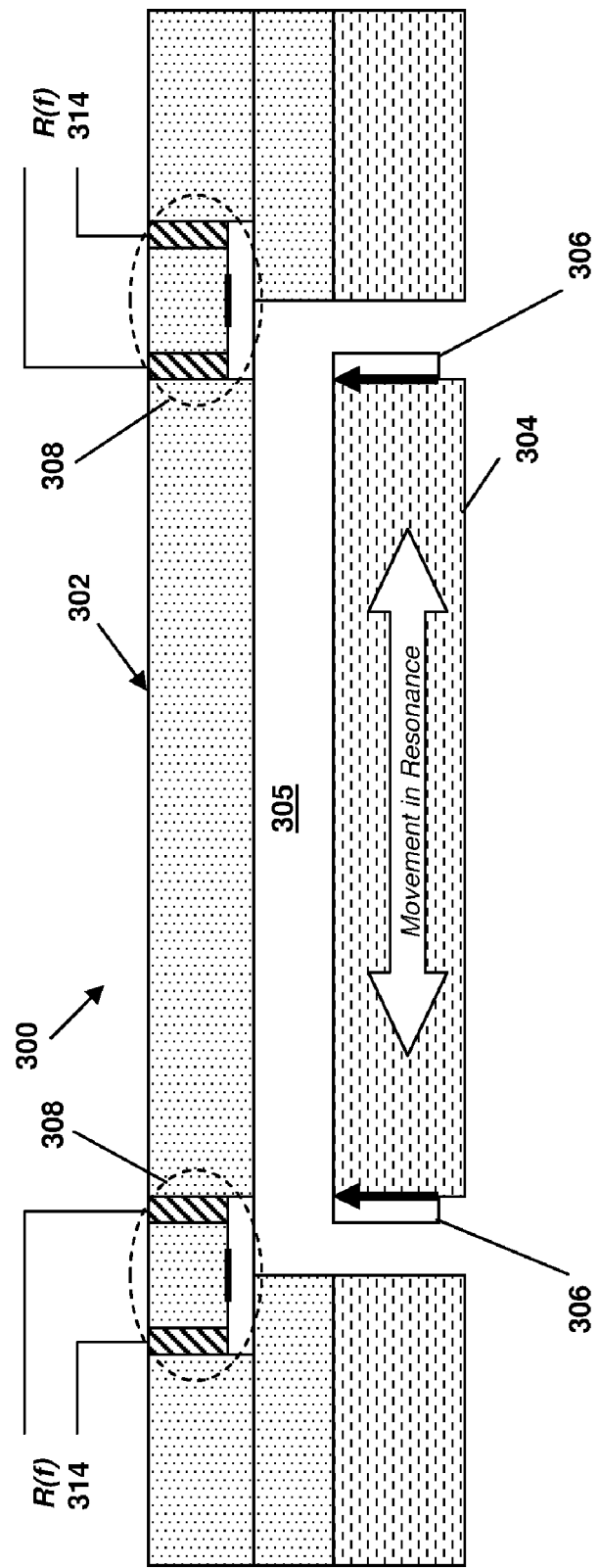
FIG. 5 is a cross-sectional diagram of a resonating device according to one embodiment.

FIG. 5 depicts another resonator device 300 according to one embodiment. Resonator device 300 comprises a support structure 302, which can be similar to as described above for resonator device 200, and a resonator element 304. In one embodiment, resonator 304 comprises a magnetic dipole element 306 positioned on each end, and sensor elements 308 are positioned in or on support structure 302 above cavity 305 within which resonator element 304 resonates. Sensor elements 308 comprise xMR portions or elements 310. Other features of resonator device 300, such as further portions of support structure 302, measurement points 314, anchor configuration, materials, and the like can be the same as or similar to the various embodiments of resonator device 200 described above.

Thus, various embodiments of the resonator devices 200 and 300 depicted and described herein, provide stable and sensitive determination of resonant frequency through detection of changes in the resistance of xMR sensor elements. Embodiments of the invention therefore reduce or eliminate the aforementioned problems associated with other MEMS resonators.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those skilled in the art will readily appreciate that the invention may be implemented in a very wide variety of embodiments. This application is intended to cover any adaptations or variations of the various embodiments discussed herein, including the disclosure information in the attached appendices. Therefore, it is manifestly intended that this invention be limited only by the claims and the equivalents thereof.

The invention claimed is:

1. A silicon micro-electromechanical system (MEMS) device comprising:
    a resonator element comprising a magnetic portion having a fixed magnetization;
    at least one sensor element comprising a magnetoresistive portion, wherein a magnetization and a resistivity of the magnetoresistive portion vary according to a proximity of the magnetic portion; and
    a support structure defining at least a portion of a cavity formed therein, wherein the resonator element is disposed in the cavity and the at least one sensor element forms part of the support structure.

2. The device of claim 1, wherein the resistivity of the magnetoresistive portion is related to a resonant frequency of the resonator element.

3. The device of claim 1, wherein the magnetoresistive portion comprises one of a tunneling magnetoresistive (TMR), giant magnetoresistive (GMR), or anisotropic magnetoresistive (AMR) effect material.

4. The device of claim 1, wherein the at least one sensor element comprises a first sensor element disposed proximate a first end of the resonator element and a second sensor element disposed proximate a second end of the resonator element.

5. The device of claim 4, wherein the support structure comprises a first side portion, a second side portion, and a third portion connecting the first and second side portions, and wherein the first sensor element is at least partially disposed in the first side portion and the second sensor element is at least partially disposed in the second side portion.

6. The device of claim 4, wherein the support structure comprises a first side portion, a second side portion, and a third portion connecting the first and second side portions, and wherein the first and second sensor elements are at least partially disposed in the third portion.

7. A silicon micro-electromechanical system (MEMS) device comprising:
 a support structure defining a cavity;
 a resonator element disposed in the cavity and comprising a magnetic portion having a fixed magnetization;
 at least one magnetoresistive portion disposed in the support structure and having a magnetization configured to vary according to a proximity of the magnetic portion; and
 circuitry coupled to the at least one magnetoresistive portion and adapted to sense a resistance of the magnetoresistive portion.

8. The device of claim 7, wherein the magnetoresistive portion comprises one of a tunneling magnetoresistive (TMR), giant magnetoresistive (GMR), or anisotropic magnetoresistive (AMR) effect material.

9. The device of claim 7, wherein the at least one magnetoresistive portion comprises first and second magnetoresistive portions spaced apart along a length of the resonator element.

10. The device of claim 9, wherein a resistance of the first magnetoresistive portion is 180 degrees out of phase of a resistance of the second magnetoresistive portion.

11. The device of claim 7, further comprising circuitry adapted to determine a resonant frequency of the resonator element from the resistance.

* * * * *